(12) United States Patent
Sugimoto et al.

(10) Patent No.: US 9,583,820 B2
(45) Date of Patent: *Feb. 28, 2017

(54) VEHICLE-MOUNTED ANTENNA DEVICE

(71) Applicant: DENSO CORPORATION, Kariya (JP)

(72) Inventors: Yuji Sugimoto, Kariya (JP); Hirohito Matsui, Okazaki (JP); Tadao Suzuki, Kariya (JP); Ryohei Kataoka, Okazaki (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 3 days.

This patent is subject to a terminal disclaimer.

(21) Appl. No.: 14/424,868

(22) PCT Filed: Jun. 20, 2013

(86) PCT No.: PCT/JP2013/003860
§ 371 (c)(1),
(2) Date: Feb. 27, 2015

(87) PCT Pub. No.: WO2014/033995
PCT Pub. Date: Mar. 6, 2014

(65) Prior Publication Data
US 2015/0229020 A1   Aug. 13, 2015

(30) Foreign Application Priority Data
Sep. 3, 2012 (JP) .................... 2012-193251

(51) Int. Cl.
*H01Q 1/32* (2006.01)
*H01Q 1/42* (2006.01)
(Continued)

(52) U.S. Cl.
CPC ............. *H01Q 1/3275* (2013.01); *H01Q 1/02* (2013.01); *H01Q 1/42* (2013.01); *H01Q 9/42* (2013.01);
(Continued)

(58) Field of Classification Search
CPC ............................... H01Q 1/3275; H01Q 1/02
See application file for complete search history.

(56) References Cited

U.S. PATENT DOCUMENTS

| 2010/0013724 A1 | 1/2010 | Ohshima et al. | |
| 2010/0060529 A1* | 3/2010 | Schlub | H01Q 9/42 343/702 |

(Continued)

FOREIGN PATENT DOCUMENTS

| JP | 2004215152 A | 7/2004 |
| JP | 2009135741 A | 6/2009 |

(Continued)

OTHER PUBLICATIONS

International Search Report and Written Opinion (in Japanese with English Translation) for PCT/JP2013/003860, mailed Sep. 3, 2013; ISA/JP.

*Primary Examiner* — Hoang V Nguyen
*Assistant Examiner* — Michael Bouizza
(74) *Attorney, Agent, or Firm* — Harness, Dickey & Pierce, P.L.C.

(57) ABSTRACT

A vehicle-mounted antenna device includes a base, a board, a circuit section, and a housing. The base is mountable on a roof of a vehicle. The board has an antenna element section and is stood on the base. The circuit section is implemented on the board and serves as at least part of a wireless communication circuit electrically connected to the antenna element section. The housing is made of a resin material and forms a projection of an outer shape of the vehicle. The
(Continued)

board and the circuit section are located in space formed by the base and the housing. A heat transfer path having a thermal conductivity higher than that of air is formed between the circuit section and the housing without passing the base.

14 Claims, 4 Drawing Sheets

(51) Int. Cl.
    *H05K 1/02*     (2006.01)
    *H05K 1/18*     (2006.01)
    *H05K 5/00*     (2006.01)
    *H01Q 9/42*     (2006.01)
    *H01Q 1/02*     (2006.01)

(52) U.S. Cl.
    CPC ............ *H05K 1/0203* (2013.01); *H05K 1/028* (2013.01); *H05K 1/181* (2013.01); *H05K 5/003* (2013.01); *H05K 2201/10098* (2013.01)

(56) References Cited

U.S. PATENT DOCUMENTS

| | | |
|---|---|---|
| 2010/0265147 A1 | 10/2010 | Wakui et al. |
| 2012/0081256 A1 | 4/2012 | Aizawa et al. |
| 2012/0326934 A1 | 12/2012 | Wakui et al. |
| 2013/0176180 A1 | 7/2013 | Wakui et al. |

FOREIGN PATENT DOCUMENTS

| | | |
|---|---|---|
| JP | 2010021856 A | 1/2010 |
| JP | 2010096588 A | 4/2010 |
| JP | 2012080388 A | 4/2012 |
| JP | 2012161075 A | 8/2012 |

* cited by examiner

VEHICLE-MOUNTED ANTENNA DEVICE

CROSS REFERENCE TO RELATED APPLICATIONS

This application is a U.S. National Phase Application under 35 U.S.C. 371 of International Application No. PCT/JP2013/003860 filed on Jun. 20, 2013 and published in Japanese as WO 2014/033995 A1 on Mar. 6, 2014. This application is based on and claims the benefit of priority from Japanese Patent Application No. 2012-193251 filed on Sep. 3, 2012. The entire disclosures of all of the above applications are incorporated herein by reference.

TECHNICAL FIELD

The present disclosure relates to vehicle-mounted antenna devices and in particular, relates to a vehicle-mounted antenna device used for vehicle-to-vehicle communication and vehicle-to-road-side communication.

BACKGROUND ART

As disclosed in a patent literature 1, an antenna device is known that has a GPS antenna, a DTV antenna, and a radio antenna which are placed in space formed by an antenna base (hereinafter referred to as a base) and an antenna cover (hereinafter referred to as a housing) as a projection of a vehicle outer shape.

PRIOR ART LITERATURES

Patent Literature

Patent Literature 1: JP 2012-80388A

SUMMARY OF INVENTION

In antenna devices, as frequencies of radio waves to be used become higher, loss in a transmission cable, i.e., transmission loss becomes more significant. In particular, an antenna device used for vehicle-to-vehicle communication and vehicle-to-road-side communication uses radio waves of a high frequency of 5.9 GHz band to be used become higher, and therefore the transmission loss becomes significant. The transmission loss may be reduced by forming an antenna element section on a board to be stood on a base and by implementing a circuit section serving as at least part of a wireless communication circuit on the board so that the circuit section can be located close to the antenna element section.

In the antenna device disclosed in the patent literature 1, when the circuit section is implemented on the board in this way, the circuit section is placed inside the housing. Therefore, heat generated by the circuit section stays inside inner space and is not sufficiently dissipated from the circuit section. As a result, a performance of the circuit section may be degraded.

In particular, when the antenna device is mounted on a roof of a vehicle, heat radiated from the sun is transferred to the base through the roof. Accordingly, the heat of the base is transferred to the circuit section and also dissipated in the space. Therefore, it is likely that the performance of the circuit section is degraded. However, forming a vent or adding a cooling fan is undesirable from a design perspective because the housing is part of the outer shape of the vehicle.

In view of the above, it is an object of the present disclosure to reduce degradation in performance of a circuit section without loss of design of a housing in a vehicle-mounted antenna device which uses radio waves of a high frequency.

According to a first aspect of the present disclosure, a vehicle-mounted antenna device includes a base, a board, a circuit section, and a housing. The base is mountable on a roof of a vehicle. The board has an antenna element section and is stood on the base. The circuit section is implemented on the board and serves as at least part of a wireless communication circuit electrically connected to the antenna element section. The housing is made of a resin material and forms a projection of an outer shape of the vehicle. The board and the circuit section are located in space formed by the base and the housing. A heat transfer path having a thermal conductivity higher than that of air is formed between the circuit section and the housing without passing the base.

Thus, since the circuit section is implemented on the board, i.e., since the circuit section is located close to the antenna element section, transmission loss can be reduced even when radio waves of a high frequency are used. Therefore, for example, the vehicle-mounted antenna device can be suitable for applications where radio waves of a frequency of a few GHz band are used.

Further, the heat transfer path having a thermal conductivity higher than that of air is formed between the circuit section and the housing without passing the base. Thus, although the circuit section is located in the space between the housing and the base, heat generated in the circuit section can be dissipated to the housing. Further, heat radiated from the sun and transferred from the roof to the circuit section through the board can be dissipated to the housing. Therefore, degradation in performance of the circuit section caused by a temperature increase can be reduced without loss of design of the housing. It is noted that the meaning of "stood" is that the board is mounted on the base so that a thickness direction of the board can be different from a direction perpendicular to the base.

According to a second aspect of the present disclosure, the circuit section is implemented on the board at a position away from the base in a direction perpendicular to the base.

Since the circuit section is located away from the base, the heat radiated from the sun and transferred to the circuit section can be reduced. Accordingly, the degradation in the performance of the circuit section caused by the temperature increase can be reduced.

BRIEF DESCRIPTION OF THE DRAWINGS

The above and other objects, features and advantages of the present disclosure will become more apparent from the following detailed description made with reference to the accompanying drawings. In the drawings.

EMBODIMENTS FOR CARRYING OUT INVENTION

Below, embodiments of the present disclosure are described with reference to the drawings. Throughout the embodiments, like characters of reference indicate the same or equivalent parts.

(First Embodiment)

Figure 1:
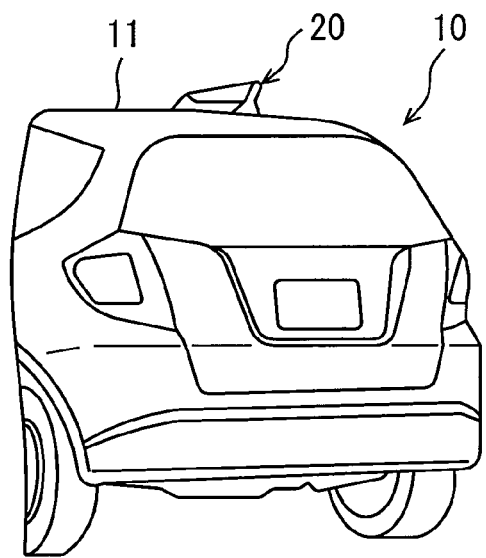
FIG. 1 is a diagram illustrating a position where a vehicle-mounted antenna device according to a first embodiment is mounted.

As shown in FIG. 1, a vehicle-mounted antenna device 20 according to the present embodiment is mounted on a roof 11 of a vehicle 10. The vehicle-mounted antenna device 20 is what is called a shark fin antenna device. The vehicle-mounted antenna device 20 is hereinafter simply referred to as the antenna device 20.

Figure 2:
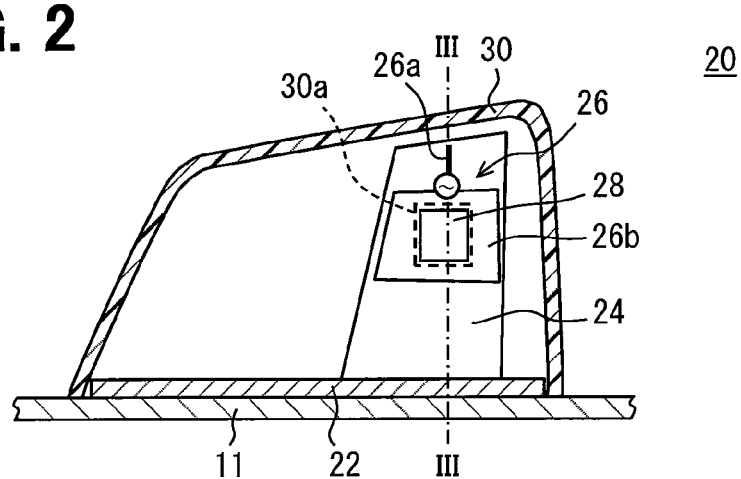
FIG. 2 is a diagram illustrating a cross-sectional view of a simplified structure of the vehicle-mounted antenna device according to the first embodiment.
Figure 3:
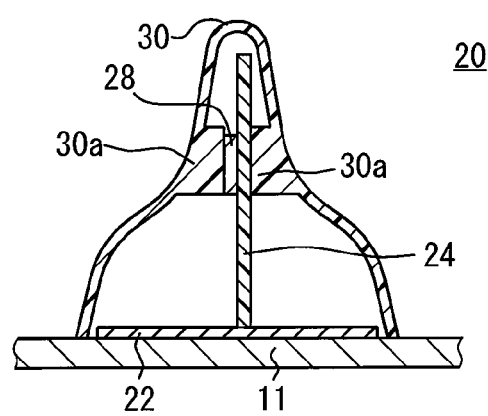
FIG. 3 is a diagram illustrating a cross-sectional view taken along the line III-III in FIG. 2.

As shown in FIGS. 2 and 3, the antenna device 20 mainly includes a base 22, a board 24 stood on the base 22, a circuit section 28 implemented on the board 24, and a housing 30 made of a resin material and forming a projection of a vehicle outer shape.

The base 22 is used to fix the board 24 to the vehicle 10 and mounted on the roof 11 through a mounting member which is not shown. The base 22 has a flat plate shape and is mounted almost parallel to the roof 11. Further, when the base 22 is made of a metal material and electrically connected to the roof 11 through the mounting member, the base 22 serves as a ground plane. Whether or not it is used as a ground plane can be determined by the intended used of the antenna device 20.

The board 24 has an antenna element section 26. According to the present embodiment, for example, the antenna element section 26 has an antenna designed for vehicle-to-vehicle communication which uses radio waves of a frequency of 5.9 GHz band.

The board 24 is what is called a printed board, and the antenna element section 26 is formed as part of wiring patterns of the printed board. The board 24 has a base member made of an electrically insulating material, and the antenna element section 26 is formed as a wiring pattern on a surface of at least one side of the base member. According to the first embodiment, the antenna element section 26 is formed by patterning copper foil on one surface of the base member. The antenna element section 26 includes a monopole antenna element 26a and a large-width portion 26b. The large-width portion 26b is connected to one end of the antenna element 26a and serves as a ground. The board 24 is stood on the base 22. The meaning of "stood" is that the board 24 is mounted on the base 22 so that a thickness direction of the board 24 can be different from a direction perpendicular to the base 22. The direction perpendicular to the base 22 is a thickness direction of the base 22. According to the present embodiment, the board 24 is fixed to the base 22 by a fixing member, which is not shown, so that the surface of the board 24 where the antenna element section 26 is formed can be almost orthogonal to a surface of the base 22 where the board 24 is mounted. In other words, the board 24 is fixed to the base 22 so that the thickness direction of the board 24 can be almost orthogonal to the thickness direction of the base 22.

The circuit section 28 is implemented on the board 24. The circuit section 28 is electrically connected to the antenna element section 26 and serves as at least part of a wireless communication circuit which performs wireless communication with an external device through the antenna element section 26. According to the present embodiment, the circuit section 28 includes a power amplifier for amplifying a transmitting signal. The circuit section 28 is electrically and mechanically connected to the large-width portion 26b of the antenna element section 26. In addition to the power amplifier, the circuit section 28 can include a low-noise amplifier for amplifying a receiving signal. Further, in addition to the power amplifier and the low-noise amplifier, it can include a switch for switching a power supply line between a transmitting side and a receiving side. Further, in addition to the power amplifier, the low-noise amplifier, and the switch, it can include a transmitting-side bandpass filter and a receiving-side bandpass filter. Further, it can include the whole of the wireless communication circuit.

For example, the circuit section 28 can be a circuit board having a printed board on which an electronic component is mounted, a package in which an electronic component such as a semiconductor chip is packaged, or a semiconductor chip in which a circuit is integrated. According to the present embodiment, the circuit section 28 is a mold package.

The housing 30 is made of a resin material and forms the projection of the vehicle outer shape. According to the present embodiment, the board 24 on which the circuit section 28 is already implemented is located in a space formed by the housing 30 and the base 22. The housing 30 is shaped like a shark fin so that it can form a projection of the roof 11. As shown in FIG. 3, the housing 30 according to the present embodiment is structured so that, a width of the space, where the board 24 is located, in the thickness direction of the board 24 can decrease with an increase in a distance from the base 22. In other words, a distance between the board 24 and the housing 30 in the thickness direction of the board 24 decreases with an increase in a distance from the base 22 in the thickness direction of the base 22.

The housing 30 has a thickened portion 30a. The thickened portion 30a is thickest in the housing 30 and located at least to face the circuit section 28. According to the present embodiment, as indicated by a broken line in FIG. 2, the thickened portion 30a is formed corresponding to the circuit section 28 in the housing 30. Further, in the housing 30, the thickened portion 30a is formed corresponding to the circuit section 28 on the opposite side of the board 24 from the side where the antenna element section 26 is formed. That is, a pair of convex thickened portions 30a is opposed to each other. The board 24 on which the circuit section 28 is already implemented is pressed into the pair of thickened portions 30a so that the circuit section 28 can be in contact with one thickened portion 30a. An opposite region of the board 24 to a region where the circuit section 28 is implemented is in contact with the other thickened portion 30a.

Next, an effect of the antenna device 20 is described.

According to the present embodiment, the circuit section 28 is implemented on the board 24 having the antenna element section 26. In other words, the circuit section 28 is located close to the antenna element section 26. Thus, even when radio waves of a high frequency of a few GHz band are used, transmission loss can be reduced. Therefore, the antenna device 20 can be suitably used for vehicle-to-vehicle communication and vehicle-to-road-side communication.

When the circuit section 28 is implemented on the board 24 in this way only, heat generated in the circuit section 28, for example, heat generated by the power amplifier is transmitted to the housing 30 through layers of air between the circuit section 28 and the housing 30. Further, the roof 11 receives heat radiated from the sun, and the heat is transferred to the base 22. Then, the heat transferred to the base 22 is transferred to the circuit section 28 through the board 24 and also dissipated from the base 22 in the space between the base 22 and the housing 30. For this reason, a temperature of the circuit section 28 is likely to increase, and the heat is likely to stay in the space. As a result, an efficiency with which heat is dissipated from the circuit section 28 to the housing 30 becomes low, and a performance of the circuit section 28 may be degraded by an increase in the temperature of the circuit section 28.

In contrast, according to the present embodiment, a heat transfer path having a thermal conductivity higher than that of air is formed between the circuit section 28 and the housing 30 without passing the base 22. Specifically, the circuit section 28 is in direct contact with the thickened portion 30a of the housing 30 so that the heat transfer path can be formed between the circuit section 28 and the housing 30. Thus, although the circuit section 28 is located in the space between the housing 30 and the base 22, the heat generated in the circuit section 28 can be dissipated to the housing 30. The housing 30 can be cooled by air flow when the vehicle is moving. Therefore, the degradation in the performance of the circuit section 28 caused by the temperature increase can be reduced without forming a vent or adding a cooling fan, i.e., without loss of design of the housing 30.

In particular, according to the present embodiment, an opposite surface of the circuit section 28 to the board 24 is in contact with the thickened portion 30a of the housing 30. In such an approach, the heat of the circuit section 28 can be dissipated directly to the housing 30. Further, since the housing 30 has the thickened portion 30a, the distance between the housing 30 and the circuit section 28 is small so that the heat can be dissipated easily. Further, according to the present embodiment, the opposite region of the board 24 to the region where the circuit section 28 is implemented is in contact with the other thickened portion 30a. Thus, the heat of the circuit section 28 can be dissipated to the other thickened portion 30a through the board 24.

Figure 4:
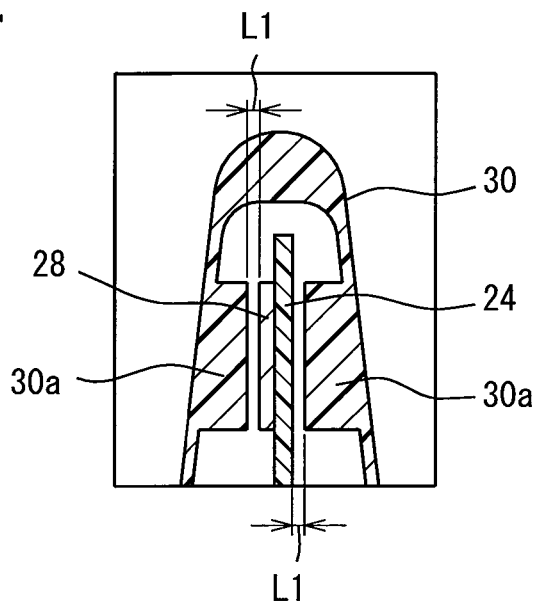
FIG. 4 is a diagram illustrating a simplified structure of a vehicle-mounted antenna device used in a simulation.
Figure 5:
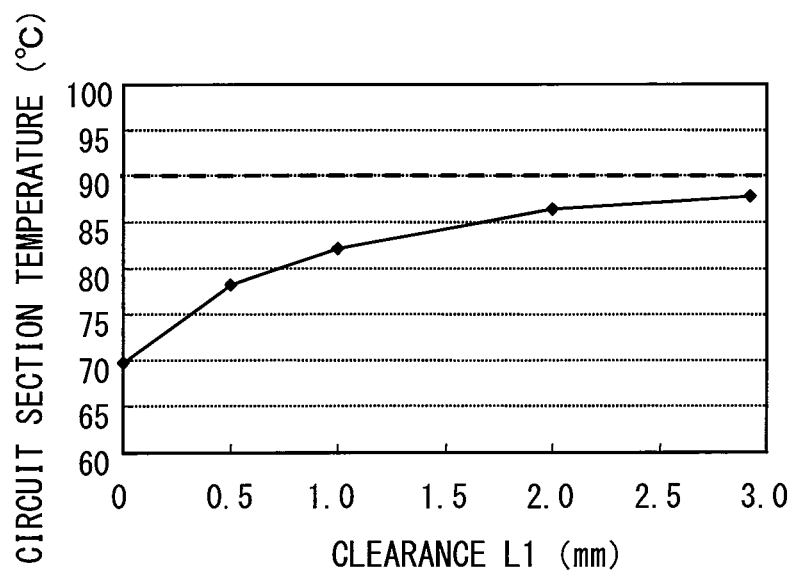
FIG. 5 is a diagram illustrating a result of the simulation.

The present inventors have confirmed the above effect in simulation using thermal fluid analysis. In the simulation, an outside air temperature is 45° C., and a temperature of the roof 11 is 120° C. Further, as shown in FIG. 4, a clearance between the circuit section 28 and the thickened portion 30a and a clearance between the opposite region of the board 24 to the region where the circuit section 28 is implemented and the other thickened portion 30a are equal to each other and set to L1. FIG. 5 shows a relationship between the clearance L1 and a temperature of the circuit section 28. When the clearance L1 is zero, i.e., when the circuit section 28 and the opposite region of the board 24 to the region where the circuit section 28 is implemented are in contact with the corresponding thickened portions 30a, the temperature of the circuit section 28 is about 70° C. As the clearance L1 is larger, the temperature of the circuit section 28 is higher. For example, when the clearance L1 is 0.5 mm, the temperature of the circuit section 28 is about 78° C. As indicated by a broken line in FIG. 5, when there is no thickened portion 30a, the temperature of the circuit section 28 is about 90° C. From this result, it is found out that the temperature of the circuit section 28 can be reduced by bringing the circuit section 28 in direct contact with the thickened portion 30a of the housing 30 so that the heat transfer path can be formed between the circuit section 28 and the housing 30. In other words, it is found out that the degradation in the performance of the circuit section 28 can be reduced.

Further, according to the present embodiment, the circuit section 28 is implemented on the board 24 at a position away from the base 22 in the direction perpendicular to the base 22. Since the circuit section 28 is located away from the base 22, the heat radiated from the sun and transferred to the circuit section 28 can be reduced. Accordingly, the degradation in the performance of the circuit section 28 caused by the temperature increase can be reduced.

Further, according to the present embodiment, the circuit section 28 includes the power amplifier which generates the most heat in the wireless communication circuit. However, as described above, the heat transfer path having a thermal conductivity higher than that of air is formed between the circuit section 28 and the housing 30. Therefore, although the power amplifier is included, the degradation in the performance of the circuit section 28 can be reduced.

Figure 6:
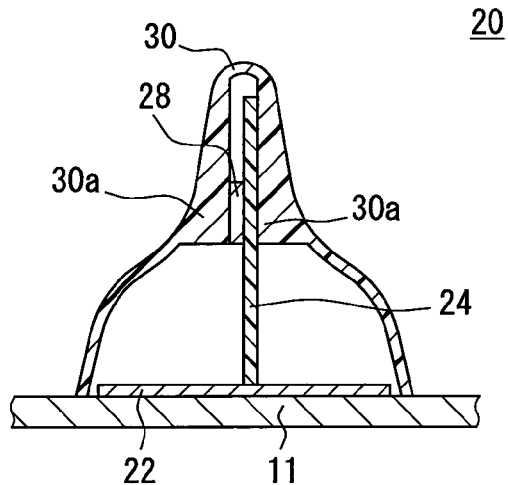
FIG. 6 is a diagram illustrating a cross-sectional view of a vehicle-mounted antenna device according to a modification of the first embodiment.

In the present embodiment, one thickened portion 30a is located to face the circuit section 28, and the other thickened portion 30a is located to face the opposite region of the board 24 to the region where the circuit section 28 is implemented. However, areas where the thickened portions 30a are formed are not limited to the embodiment. For example, as shown in FIG. 6, the pair of thickened portions 30a can be elongated to a tip of the projection of the housing 30 while being spaced from each other by a predetermined distance.

(Second Embodiment)

Descriptions of the same structures of the present embodiment as those of the antenna device 20 of the above-described embodiment are omitted.

Figure 7:
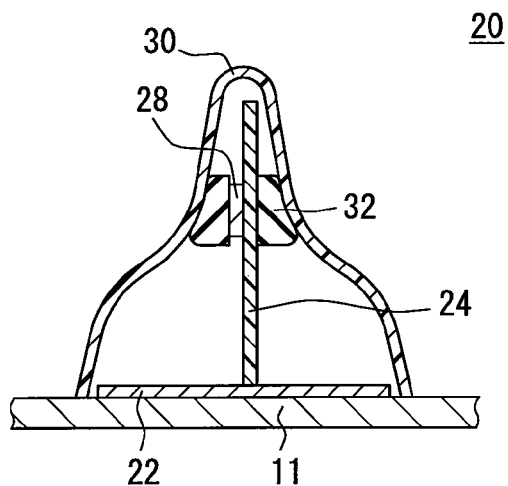
FIG. 7 is a diagram illustrating a cross-sectional view of a simplified structure of a vehicle-mounted antenna device according to a second embodiment.

As exemplified in FIG. 7, according to the present embodiment, a heat transfer member 32 made of a material having a thermal conductivity higher than that of air is interposed between the circuit section 28 and the housing 30 to provide a heat transfer path. In particular, in an example shown in FIG. 7, the heat transfer member 32 is a ring-shaped member made of rubber, which is an elastic member. The ring-shaped member as the heat transfer member 32 is in contact with and fixed by adhesive or the like to each of the circuit section 28 and the opposite region of the board 24 to the region where the circuit section 28 is implemented.

When the heat transfer member 32 is interposed between the circuit section 28 and the housing 30, the heat dissipation efficiency can be improved compared to when the heat of the circuit section 28 is dissipated to the housing 30 through air. Further, when the heat transfer member 32 has an elastic member such as a ring-shaped member made of rubber as described above, assembly can be easily done while forming the heat transfer path between the ring-shaped member and the housing 30 because the ring-shaped member is elastically deformed in the assembly.

The heat transfer member 32 is not limited to the present embodiment. The heat transfer member 32 only needs to have at least one of kinds of members made of a material having a thermal conductivity higher than that of air including a member made of metal such as Cu, a member made of rubber, a member made of resin, and a member made of gel.

Figure 8:
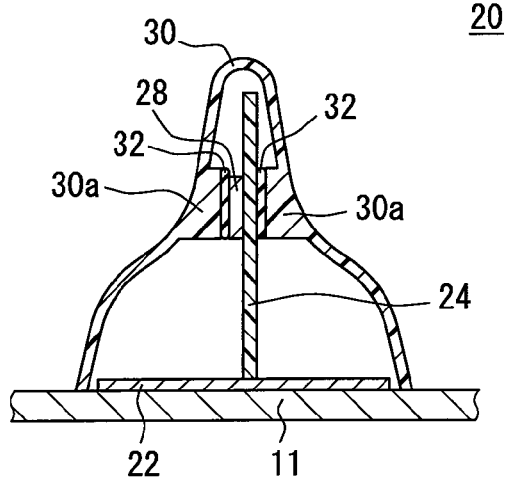
FIG. 8 is a diagram illustrating a cross-sectional view of a vehicle-mounted antenna device according to a modification of the second embodiment.

For example, as shown in FIG. 8, a heat-dissipating gel as the heat transfer member 32 can be interposed between the circuit section 28 and the thickened portion 30a of the housing 30. Likewise, a heat-dissipating gel as the heat transfer member 32 can be interposed between the thickened portion 30a and the opposite region of the board 24 to the region where the circuit section 28 is implemented.

(Third Embodiment)

Descriptions of the same structures of the present embodiment as those of the antenna device 20 of the above-described embodiment are omitted.

Figure 9:
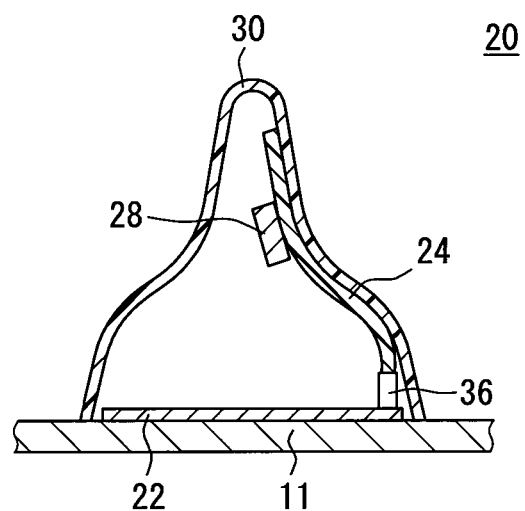
FIG. 9 is a diagram illustrating a cross-sectional view of a simplified structure of a vehicle-mounted antenna device according to a third embodiment.
Figure 10:
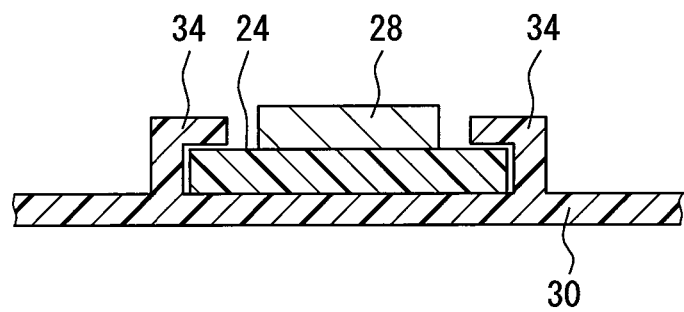
FIG. 10 is a diagram illustrating an enlarged cross-sectional view of a guide portion of a housing in FIG. 9.

As exemplified in FIGS. 9 and 10, according to the present embodiment, the board 24 is a flexible board. Further, the housing 30 has a guide portion 34 for allowing the board 24 to be placed along its inner surface. Out of the opposite surface of the board 24 to the surface where the circuit section 28 is implemented, at least the opposite region of the board 24 to the region where the circuit section 28 is implemented is in contact with the inner surface of the housing 30. It is noted that a character 36 in FIG. 9 represents a connector.

When the board 24 is a flexible board as described above, the opposite region of the board 24 to the region where the circuit section 28 is implemented can be brought in contact with the inner surface of the housing 30 without the thickened portion 30a. Thus, a heat transfer path is formed between the circuit section 28 and the housing 30 through the board 24. Therefore, the degradation in the performance of the circuit section 28 caused by the temperature increase can be reduced without loss of design of the housing 30.

(Modifications)

While the present disclosure has been described with reference to the embodiments, it is to be understood that the disclosure is not limited to the embodiments. The present disclosure is intended to cover various modifications and equivalent arrangements inside the spirit and scope of the present disclosure.

The antenna element section 26 is not limited to the embodiments.

In the embodiments, the circuit section 28 is implemented on the board 24 at a position away from the base 22. However, the position of the circuit section 28 relative to the base 22 is not limited to the embodiments, as long as the circuit section 28 is implemented on the board 24. For example, the circuit section 28 can be in contact with the base 22. However, for the reason as discussed above, it is preferable that they should be spaced from each other.

In the embodiments, the circuit section 28 is implemented on one side of the board 24. Alternatively, the circuit section 28 can be implemented on both sides of the board 24.

In the embodiments, the circuit section 28 is in contact with the thickened portion 30a of the housing 30. However, a portion at which the housing 30 is in contact with the circuit section 28 is not limited to the thickened portion 30a. The circuit section 28 can be in contact with a portion of the housing 30 other than the thickened portion 30a. Further, the circuit section 28 can be in contact with the housing 30 which does not have the thickened portion 30a, i.e., which has a uniform thickness.

In the embodiments, the antenna element section 26 is designed for vehicle-to-vehicle communication which uses radio waves of a frequency of 5.9 GHz band. However, the frequency of radio waves used by the antenna element section 26 and the use of the antenna element section 26 are not limited to the embodiments.

What is claimed is:

1. A vehicle-mounted antenna device comprising:
a base mountable on a roof of a vehicle;
a board having an antenna element section and stood on the base;
a circuit section implemented on the board and serving as at least part of a wireless communication circuit electrically connected to the antenna element section, and
a housing made of a resin material and forming a projection of an outer shape of the vehicle, wherein
the board and the circuit section are located in space formed by the base and the housing, and
a heat transfer path made of a material having a thermal conductivity higher than that of air, wherein
the circuit section is in direct contact with a center portion of a wall portion of the housing through the heat transfer path.

2. The vehicle-mounted antenna device according to claim 1, wherein
the circuit section is implemented on the board at a position away from the base in a direction perpendicular to the base.

3. The vehicle-mounted antenna device according to claim 1, wherein
the circuit section has a power amplifier configured to amplify a transmitting signal.

4. The vehicle-mounted antenna device according to claim 1, further comprising:
a heat transfer member made of a material having a thermal conductivity higher than that of air is interposed between the circuit section and the housing.

5. The vehicle-mounted antenna device according to claim 4, wherein
the heat transfer member has at least an elastic member.

6. The vehicle-mounted antenna device according to claim 1, wherein
the circuit section is in contact with the housing.

7. The vehicle-mounted antenna device according to claim 4, wherein
the housing has a thickened portion located at least to face the circuit section, and
the thickened portion is thickest in the housing.

8. The vehicle-mounted antenna device according to claim 1, wherein
the board is a flexible board,
the housing has a guide portion configured to allow the flexible board to be placed along its inner surface, and
out of an opposite surface of the flexible board to a surface where the circuit section is implemented, at least an opposite region of the flexible board to a region where the circuit section is implemented is in contact with the inner surface of the housing.

9. The vehicle-mounted antenna device according to claim 1, wherein
the housing has an inner surface including an inner surface portion opposed to the circuit section,
the circuit section and the inner surface portion of the housing form the heat transfer path by:
being directly in contact with each other; or
being indirectly in contact with each other to pass through a heat transfer member made of a material having a thermal conductivity higher than that of air.

10. The vehicle-mounted antenna device according to claim 1, wherein
the circuit section and the housing form the heat transfer path by being directly or indirectly in contact with each other without passing both the base and a layer of air.

11. The vehicle-mounted antenna device according to claim 1, wherein
the circuit section and the housing form the heat transfer path by being in contact with each other at a contact portion to pass though the contact portion.

12. The vehicle-mounted antenna device according to claim 1, wherein
the housing is integrally formed of resin, and
the circuit section and the housing form the heat transfer path by being in contact with each other.

13. The vehicle-mounted antenna device according to claim 1, wherein
the circuit section is a mold package in which a semiconductor chip is packaged.

14. The vehicle-mounted antenna device according to claim 1, wherein
the circuit section is mounted on the board.

* * * * *